United States Patent [19]

Van de Plassche

[11] 4,004,247
[45] Jan. 18, 1977

[54] VOLTAGE-CURRENT CONVERTER
[75] Inventor: Rudy Johan Van de Plassche, Eindhoven, Netherlands
[73] Assignee: U.S. Philips Corporation, New York, N.Y.
[22] Filed: June 11, 1975
[21] Appl. No.: 586,051
[30] Foreign Application Priority Data
June 14, 1974 Netherlands ............... 7407953
Mar. 27, 1975 Netherlands ............... 7503664
[52] U.S. Cl. .................. 330/30 D; 323/4; 330/17; 330/19; 330/22
[51] Int. Cl.² .......................... H03F 3/45
[58] Field of Search ......... 323/4; 330/19, 22, 30 R, 330/30 D, 17

[56] References Cited
UNITED STATES PATENTS
3,876,955 4/1975 Ahmed ................. 330/19 X
3,891,935 6/1975 Limberg ................ 330/22

Primary Examiner—R. V. Rolinec
Assistant Examiner—Lawrence J. Dahl
Attorney, Agent, or Firm—Frank R. Trifari; Ronald L. Drumheller

[57] ABSTRACT

A voltage-current converter having a balanced-voltage input and a balanced-current output. Each of the emitter circuits of the two input transistors includes a three-transistor current-mirror circuit, whose input circuit carries a constant current, whose output circuit carries the balanced-output current and of which the base-emitter junction of the transistor which is included in the input circuit is bridged by a semiconductor junction in the output circuit. The two current mirror circuits are coupled in that a resistor is included between the bases of the transistors which are included in the input circuits of the two current mirror circuits.

4 Claims, 9 Drawing Figures

VOLTAGE-CURRENT CONVERTER

The invention relates to a voltage-current converter with a balanced-voltage input and a balanced-current output.

Figure 5:
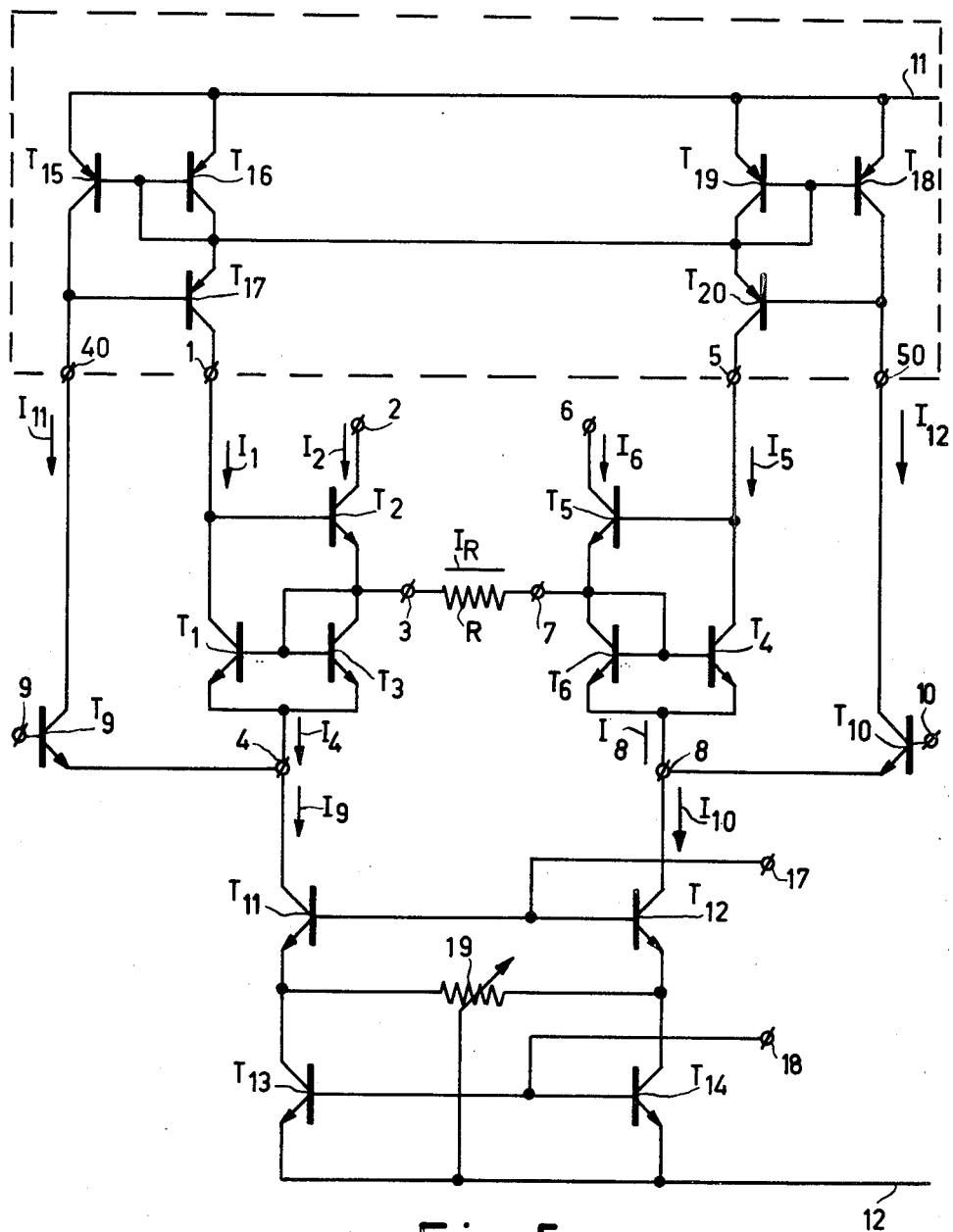

Such a voltage-current converter is known from Netherlands Patent Application Nr. 7,102,199 (PHN.5420), FIG. 5. The relevant voltage-current converter consists of two "equivalent transistors" whose "bases" constitute the balanced-voltage input, whose "collectors" constitute the balanced-current output, and whose "emitters" are mutually connected via a resistor and individually to a current source. With respect to a similar converter in which the "equivalent transistors" consist of single transistors, said voltage-current converter has the advantage that only a small part of the output signal current flows through the "base-emitter junction" of the "equivalent transistor". However, a drawback is that the "equivalent transistors" comprise transistors of both the npn and the pnp conductivity type. For technological reasons pnp transistors in integrated circuits generally take the form of lateral transistors. Lateral pnp transistors exhibit a substantially poorer performance than npn-transistors in particular with respect to the high frequency characteristics.

It is an object of the invention to provide an accurate voltage-current converter, which may take the form of an integrated circuit without the necessity of using lateral pnp transistors, at least in the signal path.

Therefore, the invention is characterized in that the converter comprises a first and a second current mirror circuit, which current mirror circuits in a first current path which is formed between a first input connection point and a common connection point each include at least the collector-emitter path of a first transistor whose emitter is connected to the common connection point, whilst in a second current path which is constituted between an output connection point and the common connection point at least the series connection of the collector-emitter path of a second transistor and a semiconductor junction is included, the semiconductor junction bridging the base-emitter junction of the first transistor, of which first transistor the base is connected to a second input connection point, a first and a second current source circuit whose outputs are connected to the first input connection point of the first and the second current mirror circuit respectively, an impedance which is included between the second input connection points of the first and the second current mirror circuit, and a first and a second input transistor whose emitters are connected to the common connection points of the first and the second current mirror circuit respectively, the balanced-voltage input being constituted by the bases of the two input transistors and the balanced-current output being constituted by the output connection points of the two current mirror circuits.

If the base currents of the various transistors are neglected, the signal current in the converter according to the invention flows between the output connection points of the first and the second current mirror circuit via a signal path which includes the series connection of the collector-emitter paths of the second transistors of the first and the second current mirror circuit and the impedance. From this an advantage of the voltage current converter according to the invention is apparent. Indeed, no circuit elements other than the elements included in said signal path carry signal currents.

In the voltage-current converter according to the invention the use of field-effect transistors and the like is by no means excluded. For example, in specific cases field-effect transistors may be used to advantage for the input transistors. In that case "base", "emitter" and "collector" should read "gate electrode", "source electrode" and "drain electrode" respectively.

With respect to the drive of the voltage-current converter according to the invention with the input transistors there are many possibilities. A first preferred embodiment is characterized with respect to the input transistors in that the first and the second input transistors are of a conductivity type opposite to and are connected in series opposition to the transistors of the current-mirror circuits.

A second preferred embodiment is characterized with respect to the input transistors in that the collectors of the first and the second input transistor are connected to the second input connection points of the first and the second current mirror circuit respectively, that the first and the second input transistor are of the same conductivity type as the transistors of the current mirror circuit, and that the emitter circuits of the first and the second input transistor include a third and a fourth current source circuit respectively.

Said embodiment has the advantage that the base-collector voltage of the input transistors is low, namely equal to the base-emitter voltage of the first transistors of the first and the second current mirror circuit, so that as input transistors transistors with a high current-gain factor may be employed.

The voltage-current converter according to the invention may for example be used as an input circuit for measuring amplifiers. For this it is desirable that the conversion factor can be adapted to the input signal level. This may be effected by for example selecting the conversion factor with a switch. For this the voltage-current converter according to the invention, in which the first and the second current mirror circuit constitute a first pair, is characterized in that the voltage-current converter comprises at least a second pair of current mirror circuits, which second pair also comprises a first and a second current mirror circuit, which exhibit the same circuit arrangement as the current mirror circuits of the first pair, whilst the common connection points of the first current mirror circuits of the first and the second pair are interconnected and the common connection points of the second current mirror circuits of the first and the second pair are also interconnected, that the second input connection points of the first and the second current mirror circuit of the second pair are also interconnected via an impedance, and that furthermore the first input connection points of the first and the second current mirror circuit of the second pair are also connected to outputs of current source circuits.

It is then possible to make the various current sources switchable, or, when required, select the output connection points of a different pair of current mirror circuits by means of switches.

The voltage-current converter with several pairs of current mirror circuits according to the invention is based on the recognition that the signal currents flow through the previously mentioned signal path. Each time including a different impedance in said signal path would have the drawback of signal current flowing through the switching units, which would influence the conversion factor. Due to the last-mentioned step according to the invention it is possible to include the switching units outside the signal path.

In respect of the switching units the previous embodiment of a voltage-current converter according to the invention is characterized in that the first input connection points of all first current mirror circuits are individually connected via switching units to the output of the first current source circuit, and that the first input connection points of all second current mirror circuits are individually connected via switching units to the output of the second current source circuit.

This embodiment has the advantage that for each pair of current mirror circuits the d.c. setting is the same. When bipolar transistors are employed for the switching units, these transistors should be of a conductivity type opposite to the conductivity type of the transistors of the first and the second current mirror circuit.

With respect to the first and the second current source circuit a preferred embodiment of the voltage-current converter according to the invention is characterized in that the first and the second current source circuit comprises a third and a fourth current mirror circuit respectively comprising transistors of a conductivity type opposite to the conductivity type of the transistors of the first and the second current mirror circuit, which two current mirror circuits in a first current path which is constituted between a first input connection point and a common connection point each include at least the collector-emitter path of a first transistor whose emitter is connected to the common connection point, and in a second current path which is formed between an output connection point and the common connection point include at least the series connection of the collector-emitter path of a second transistor and a semiconductor junction, of which second transistor the collector is connected to the output connection point, the semiconductor junction bridging the base-emitter junction of the first transistor, of which first transistor the base is connected to a second input connection point, the first input connection point of the third and the fourth current mirror circuit being connected to the collector of the first and the second input transistor respectively, which are of the same conductivity type as the transistors of the first and the second current mirror circuit, the output connection point of the third and the fourth current mirror circuit being connected to the first input connection point of the first and the second current mirror circuit respectively, and a third and a fourth current source circuit which are connected to the common connection point of the first and the second current mirror circuit respectively.

An improvement of said preferred embodiment is characterized in that the second input connection points of the third and fourth current mirror circuits are interconnected, that the third current source circuit comprises the series connection of the collector-emitter paths of a third and a fourth transistor, the fourth current source circuit comprises the series connection of the collector-emitter paths if a fifth and a sixth transistor, the emitters of the third and the fifth transistor being connected to a first point of fixed voltage, the bases being connected to a second point of fixed voltage, and the collectors being connected to the emitters of the fourth and the sixth transistor respectively, of which fourth and sixth transistor the bases are connected to a third point of fixed voltage and of which the collectors are connected to the common connection points of the first and the second current mirror circuit respectively, whilst between the emitters of the fourth and the sixth transistor a potentiometer is included, whose wiper is connected to a fourth point of fixed voltage.

A voltage-current converter in accordance with the previous embodiment or the improvement thereof with switchable conversion factor, in which the first and the second current mirror circuit from a first pair, is characterized in that the voltage-current converter comprises at least a second pair of current mirror circuits, which second pair also includes a first and a second current mirror circuit, which exhibit the same circuit arrangement as the current mirror circuits of the first pair, whilst the common connection points of the first current mirror circuits of the first and the second pair are interconnected and the common connection points of the second current mirror circuits of the first and the second pair are also interconnected, that the second input connection points of the first and the second current mirror circuit of the second pair are also interconnected via an impedance, that the base of the second transistor of the third current mirror circuit is connected to the base of an eleventh transistor of the same conductivity type as the second transistor of the third current mirror circuit, of which eleventh transistor the collector is connected to the first input connection point of the first current mirror circuit of the second pair, the switching units individually connecting the emitter of the second transistor of the third current mirror circuit and the emitter of the eleventh transistor to the second input connection point of the third current mirror circuit, and furthermore that the base of the second transistor of the fourth current mirror circuit is connected to the base of a twelfth transistor of the same conductivity type as the second transistor of the fourth current mirror circuit, of which twelfth transistor the collector is connected to the first input connection point of the second current mirror circuit of the second pair, the switching units individually connecting the emitter of the second transistor of the fourth current mirror circuit and the emitter of the twelfth transistor to the second input connection point of the fourth current mirror circuit.

In this embodiment the switching units are included in the third and the fourth current mirror circuit, whilst the switching units may be bipolar transistors For a better rejection of "common-mode" signals a preferred embodiment of a voltage-current converter according to the invention is characterized in that the first and the second current source circuit are constituted by connecting a fifth current source circuit to the bases of a seventh and an eighth transistor, which are of a conductivity type which is opposite to the conductivity type of the transistors of the first and second current mirror circuit, of which seventh and eighth transistor the emitters are interconnected and of which the collectors are connected to the bases of a ninth and a tenth transistor respectively, which are of the same conductivity type as the seventh and the eighth transistors, and of which the emitters are connected to the bases of the seventh and eighth transistor and of which the collectors are connected to the first input connection points of the first and the second current mirror circuit respectively, that the first and the second input transistor are of the same conductivity type as the transistors of the first and the second current mirror circuit, whilst the collectors of the first and the second input transistor are connected to the collectors of the seventh and the eighth transistor respectively, and that the common connection points of the first and the second current mirror circuit are connected to a sixth and a seventh current source circuit respectively.

For a switchable conversion factor the preceding embodiment, in which the first and the second current mirror circuit constitute a first pair, is characterized in that the voltage-current converter comprises at least a second pair of current mirror circuits, which second pair also comprises a first and a second current mirror circuit, which exhibit the same circuit arrangement, as the current mirror circuits of the first pair, whilst the common connection points of the first current mirror circuits of the first and the second pair are interconnected and the common connection points of the second current mirror circuits of the first and the second pair are also interconnected, that the second input connection points of the first and the second current mirror circuit of the second pair are also interconnected via an impedance, that the base of the ninth transistor is connected to the base of a thirteenth transistor of the same conductivity type as the ninth transistor, of which thirteenth transistor the collector is connected to the first input connection point of the first current mirror circuit of the second pair, the switching units connecting the emitter of the ninth transistor and the emitter of the thirteenth transistor individually to the base of the seventh transistor, and furthermore that the base of the tenth transistor is connected to the base of a fourteenth transistor of the same conductivity type as the tenth transistor, of which fourteenth transistor the collector is connected to the first input connection point of the second current mirror circuit of the second pair, switching units connecting the emitter of the tenth transistor and the emitter of the fourteenth transistor individually to the base of the eighth transistor.

Figure 1:
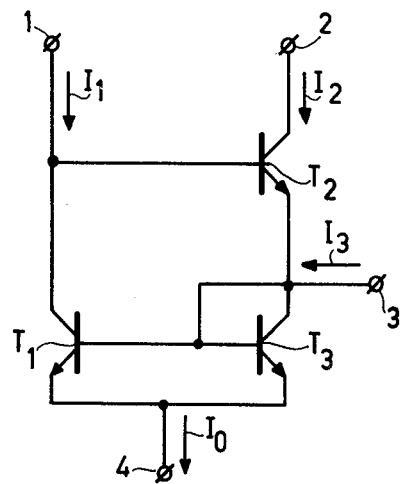
Figure 2:
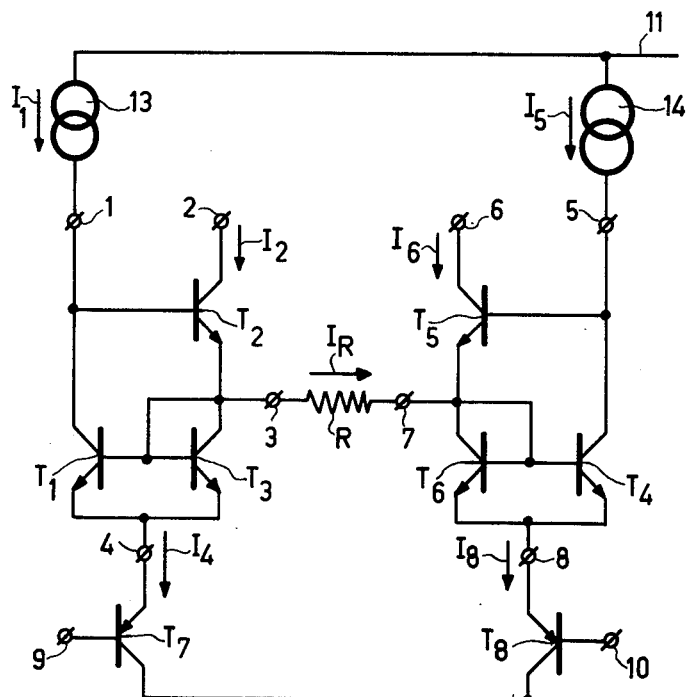
Figure 3:
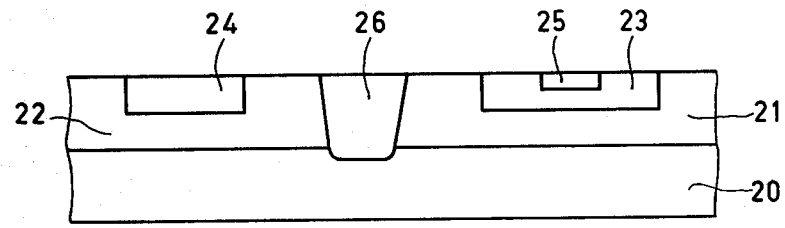
Figure 4:
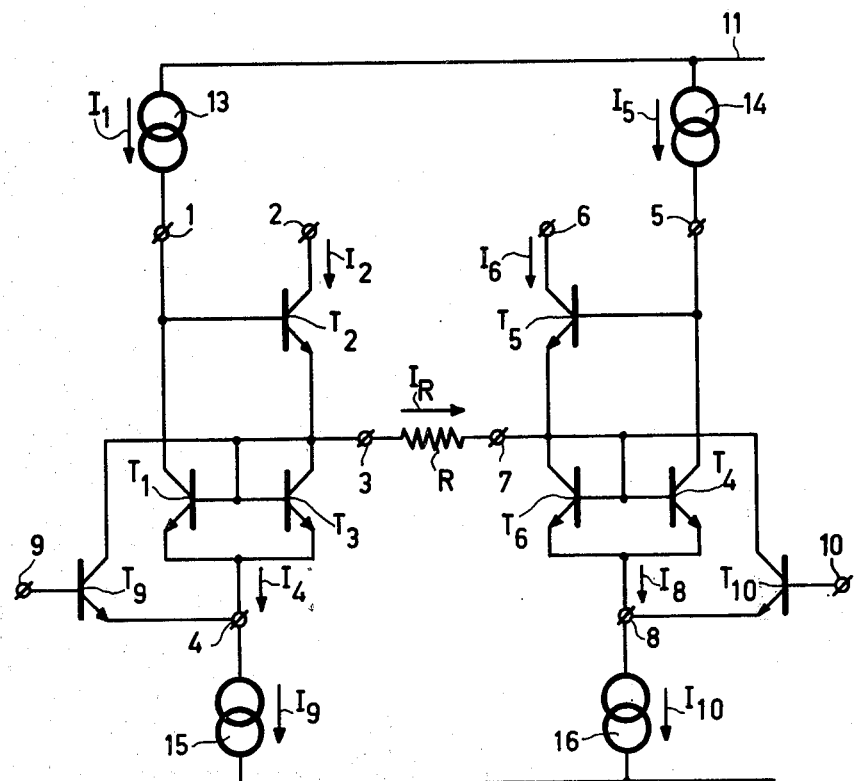
Figure 6:
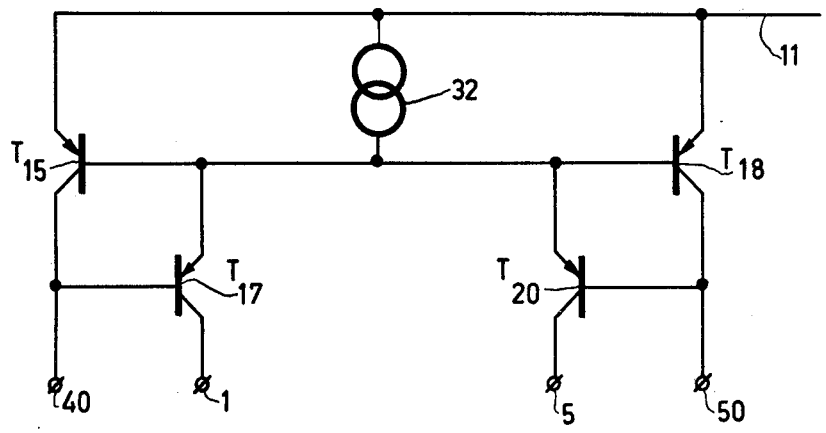
Figure 7:
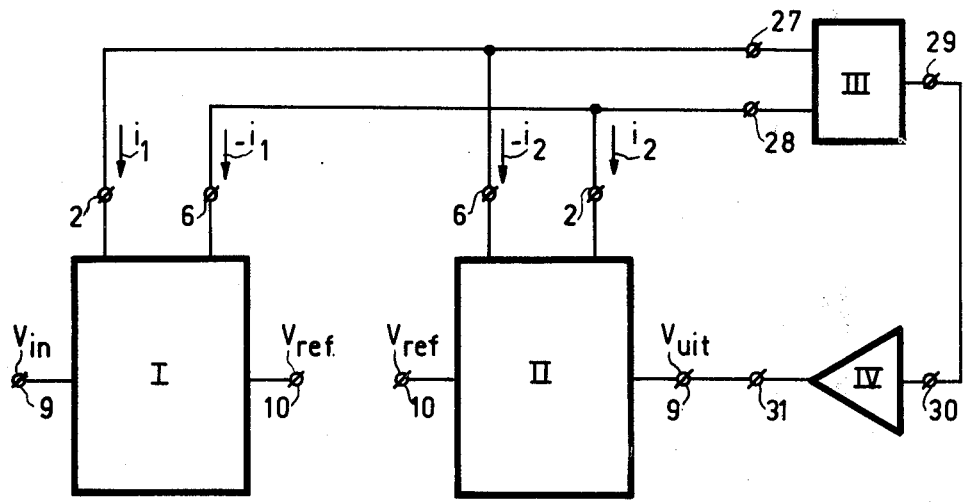
Figure 8:
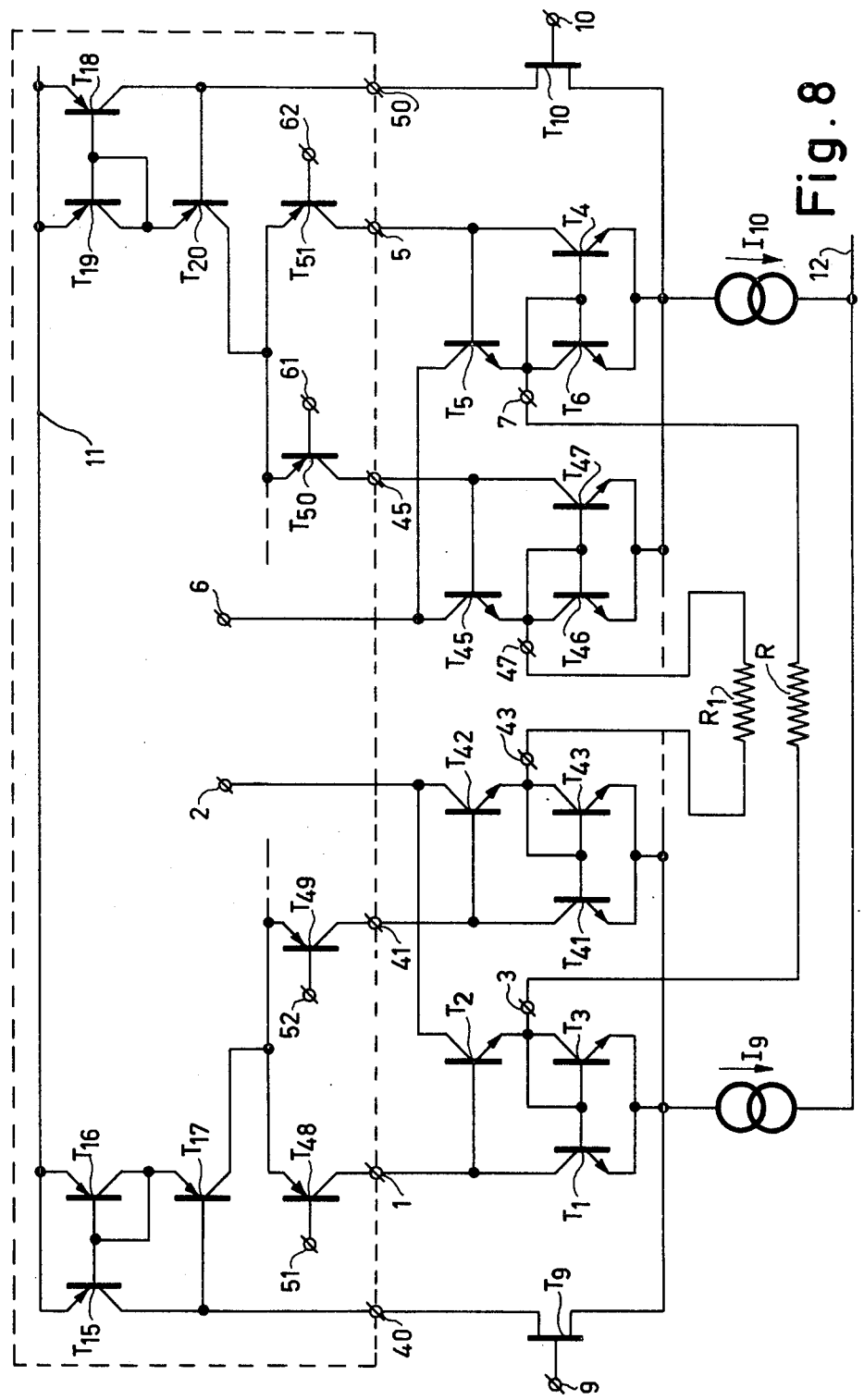
Figure 9:
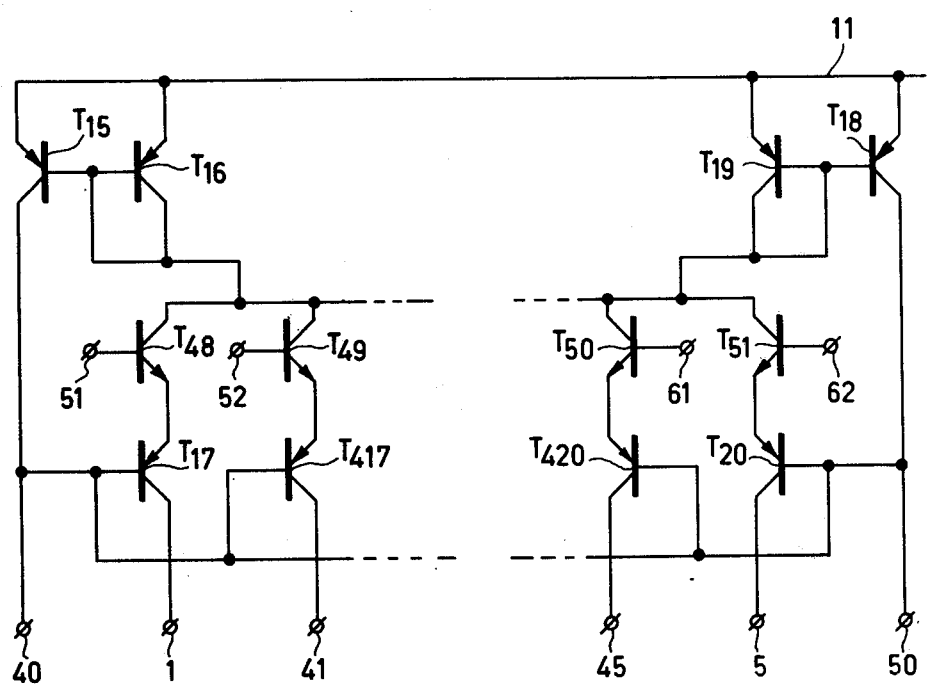

The invention will now be described in more detail with reference to the Figures, in which FIG. 1 shows a known current mirror circuit, FIG. 2 shows a first embodiment of a converter according to the invention, FIG. 3 shows the circuit arrangement of a vertical-substrate pnp transistor adjacent a vertical npn transistor, FIG. 4 shows a second embodiment of a converter according to the invention, FIG. 5 shows a third and also preferred embodiment of a converter according to the invention, FIG. 6 shows a circuit which may replace a part of the circuit of FIG. 5, FIG. 7 shows an example of an application of a voltage-current converter according to the invention, FIG. 8 shows an embodiment of a voltage-current converter according to the invention with switchable conversion factor, and FIG. 9 shows a circuit which may replace a part of the circuit of FIG. 8.

In the known current mirror circuit of FIG. 1 the current path which is constituted between a first input connection point 1 and a common connection point 4 includes the collector-emitter path of a first transistor $T_1$. The emitter of this transistor $T_1$ is connected to the common connection point 4. The current path which is formed between an output connection point 2 and the common connection point 4 includes the series connection of the collector-emitter path of a second transistor $T_2$ and a semiconductor junction, in the present example a transistor $T_3$ which is connected as a diode. The semiconductor junction then shunts the base-emitter junction of the transistor $T_1$, so that thus a current mirror is formed. The collector of the transistor $T_2$ is connected to the output connection point 2, while the base is connected to the collector of the transistor $T_1$. A second input connection point 3 is connected to the base of the transistor $T_1$. The transistor $T_1$, $T_2$ and $T_3$ are of the same conductivity type, in the present example of the npn-conductivity type.

When it is assumed that transistor $T_3$ has the same base-emitter area as the transistor $T_1$, the current which flows through the collector-emitter path of transistor $T_3$ is equal to the current which flows through the collector-emitter path of transistor $T_1$. This current then equals the current $I_1$ which is applied to the input connection point 1. When a current $I_3$ is fed to the input connection point 3, the current $I_2$ which flows through the output connection point is equal to $I_1 - I_3$. The current $I_0$ which flows through the common connection point 4 equals $2I_1$.

The current mirror circuit described with reference to FIG. 1 is used in the voltage-current converter according to the invention, of which FIG. 2 shows a first embodiment.

The voltage-current converter of FIG. 2 comprises two current mirror circuits in accordance with FIG. 1. The first current mirror circuit in accordance with FIG. 1 has the same reference letters and numerals. The second current mirror circuit in a similar manner has a first input connection point 5, a second input connection point 7, an output connection point 6, a common connection point 8, a first transistor $T_4$, a second transistor $T_5$, and a transistor $T_6$ which is connected as a diode. Between the input connection points 3 and 7 a resistor R is included. The input connection points 1 and 5 are connected to a point 11 of constant positive voltage via the current sources 13 and 14 respectively. The output connection points 2 and 6 constitute the balanced-current output of the voltage-current converter. The common connection points 4 and 8 are connected to the emitters of the input transistors $T_7$ and $T_8$ respectively. The bases of said input transistors $T_7$ and $T_8$ are connected to the balanced-voltage input terminals 9 and 10 respectively, while the collectors are connected to a point 12 of constant negative voltage.

Assume that the current which is supplied to the input connection point 1 by the current source 13 equals $I_1$ and that the current source 14 supplies a current equal to $I_5$ to the input connection point 5, then the current $I_4$ which flows through the common connection point 4 and thus through the emitter-collector path of transistor $T_7$ will equal $2I_1$, provided that the transistors $T_1$ and $T_3$ are identical, and the current $I_8$ which flows through the common connection point 8 and thus through the collector-emitter path of transistor $T_8$ will equal $2I_5$, provided that the transistors $T_4$ and $T_6$ are identical. Through the transistor $T_3$, which is connected as a diode, a current flows which equals $I_1$ and similarly a current which equals $I_5$ flows through the transistor $T_6$ which is connected as a diode. When the currents $I_1$ and $I_5$ which are supplied by the current sources 13 and 14 are constant, the base-emitter voltages of the transistor $T_1$, $T_3$, $T_4$, $T_6$, $T_7$ and $T_8$ are constant. The voltage across the resistor R then equals the input difference voltage $\Delta V$, which appears between the connection points 9 and 10, minus the difference between the sum of the base-emitter voltages of the transistors $T_7$ and $T_3$ and the sum of the base-emitter voltages of the transistors $T_4$ and $T_8$, i.e. equal to $\Delta V$ less a constant voltage. When the currents $I_1$ and $I_5$ are equal, the transistors $T_7$ and $T_8$ are identical, and the current mirror circuits are identical, the voltage across the resistor R will equal the input difference voltage $\Delta V$. The current $I_R$ which flows through the resistor R then equals $\Delta V/R$. The current $I_2$ which flows through the output connection point 2 equals $I_1 + I_R$, while the current $I_6$ which flows through the output connection point 6 equals $I_5 - I_R$, i.e. equal to $I_1 - I_R$. Thus a balanced output current is obtained.

If the base current of the various transistors are neglected, the output signal current $I_R$ will flow from output connection point 2 via the collector-emitter path of transistor $T_2$, the resistor R and the emitter-collector path of transistor $T_5$ to the output connection point 6 and will not flow through the input transistors $T_7$, $T_8$. However, the base signal current of the transistor $T_2$ and $T_5$ does flow through the input transistors $T_7$ and $T_8$.

It is to be noted that the transistors $T_7$ and $T_8$ are pnp-transistors, but this presents less problems because the two pnp transistors are connected by the collectors to the point of the lowest potential of the circuit, so that for this purpose vertical substrate pnp-transistors may be employed, which are substantially better than lateral pnp transistors.

For clarity FIG. 3 shows the cross-section of a possible structure of a vertical-substrate pnp-transistor adjacent to a vertical npn-transistor. On the p-type substrate 20 an n-type epitaxial layer is disposed, which by a p$^+$-type isolating diffusion 26 is separated into two regions 21 and 22. By diffusion of p-type material in the regions 21 and 22 two p-type islands 23 and 24 respectively are obtained. In the p-type island 23 an n-type region 25 is formed. The emitter base and collector of the vertical-substrate pnp transistor are formed by the p-type island 24, the n-type epitaxial layer 22 and the substrate 20 respectively, while a collector connection can be made on the isolation diffusion region 26. The emitter, base and collector of the vertical npnp transistor are formed by the n-type region 25, the p-type region 23 and the n-type epitaxial layer 21 respectively.

When it is desired to replace the transistors $T_7$ and $T_8$ by npn transistors, a voltage-current converter of the second embodiment is obtained. Said second embodiment is shown in FIG. 4. Said converter is identical to the converter of FIG. 2, except for the transistors $T_7$ and $T_8$, which are replaced by npn transistors $T_9$ and $T_{10}$, and two additional current sources 15 and 16. The current source 15, which carries a current $I_9$, connects the common connection point 4 to the point 12 of constant negative potential, while the current source 16 which carries a current $I_{10}$ connects the common connection point 8 to point 12. The input connection points 9 and 10 are connected to the bases of the transistors $T_9$ and $T_{10}$ respectively. The emitters of the transistors $T_9$ and $T_{10}$ are connected to the common connection points 4 and 8 respectively, while the collectors are connected to the bases of the transistors $T_1$ and $T_4$ respectively.

In a similar way as in the converter of FIG. 2, with the proviso that the transistors $T_1$ and $T_3$ as well as $T_4$ and $T_6$ are identical, the current $I_4$ will equal $2I_1$ and the current $I_8$ will equal $2I_5$. The current which flows through the collector-emitter path of transistor $T_9$ then equals $I_9 - 2I_1$ and the current which flows through the collector-emitter path of transistor $T_{10}$ equals $I_{10} - 2I_5$. When the current $I_1$ equals the current $I_5$, the current $I_9$ equals the current $I_{10}$, the transistor $T_9$ is identical to the transistor $T_{10}$ and the two current sources are identical, the current $I_R$ will equal $\Delta V/R$. When $I_9 = 3I_1$ and, as a result, $I_{10} = 3I_1$ the balanced output currents $I_2$ and $I_6$ will equal $2I_1 + I_R$ and $2I_1 - I_R$ respectively.

Apart from the fact that the converter of FIG. 4 only comprises npn-transistors, the converter moreover has the advantage that the collector-emitter voltages of the input transistors $T_9$ and $T_{10}$ are low, because they equal the base-emitter voltage of the transistors $T_6$ and $T_3$ respectively, so that for the input transistors, transistors with a high current-gain factor may be employed, because a high current-gain factor is accompanied by a low collector-emitter breakdown voltage.

As the collector-emitter currents of the transistors $T_9$ and $T_{10}$ are constant and are determined by the current sources 13 and 15, and 14 and 16 respectively it suffices to use the current sources 15 and 16, while the collector circuits of the transistors $T_9$ and $T_{10}$ are each coupled by a current mirror to the first input circuits of the first and the second current mirror circuits. If moreover the current sources 15 and 16 are identical, the two current mirrors may be coupled, while moreover the two current sources 15 and 16 may be coupled. This leads to the embodiment of a voltage-current converter according to the invention, shown in FIG. 5.

The converter of FIG. 5 is in principle similar to that of FIG. 4. The first and the second current mirror circuit, coupled through the resistor R are not modified and bear the same reference numerals as in FIG. 4. The collectors of the input transistors $T_9$ and $T_{10}$ are connected to the collectors of the transistors $T_{15}$ and $T_{18}$, both of the pnp conductivity type. The emitter of the transistors $T_{15}$ and $T_{18}$, as well as the emitters of two pnp transistors $T_{16}$ and $T_{19}$ which are connected as diodes, are connected to the positive supply point 11. The bases of the transistors $T_{15}$, $T_{16}$, $T_{18}$ and $T_{19}$ are interconnected, so that a third and a fourth mutually coupled current mirror circuit is obtained. The collector circuit of transistor $T_{15}$ constitutes the input circuit of the third current mirror circuit and the collector circuit of the transistor $T_{18}$ constitutes the input circuit of the fourth current mirror circuit. The output circuits of the third and the fourth current mirror circuit are constituted by the collector-emitter path of the pnp transistors $T_{17}$ and $T_{20}$ respectively, whose bases are connected to the collectors of the transistors $T_{15}$ and $T_{18}$ respectively and whose emitters are connected to the collectors of the transistors $T_{16}$ and $T_{19}$ respectively. The collectors of the transistors $T_{17}$ and $T_{20}$ are connected to the input connection points 1 and 5 respectively. The common connection points 4 and 8 are connected to the collectors of the transistors $T_{11}$ and $T_{12}$ respectively, whose emitters are connected to the collectors of the transistors $T_{13}$ and $T_{14}$ respectively. The emitters of the transistors $T_{13}$ and $T_{14}$ are connected to the negative supply point 12. The bases of the transistors $T_{13}$ and $T_{14}$ are connected to a connection point 18 and the bases of the transistors $T_{11}$ and $T_{12}$ are connected to a connection point 17. The emitters of the transistors $T_{11}$ and $T_{12}$ are interconnected via a potentiometer 19, whose wiper is connected to the negative supply point 12.

Owing to the third and the fourth current mirror circuit the current $I_{11}$ which flows through the collector-emitter path of transistor $T_9$ equals the current $I_1$ and the current $I_{12}$ which flows through the collector-emitter path of the transistor $T_{10}$ equals the current $I_5$. Similarly to the converters of FIG. 2 and FIG. 4 the current $I_4$ equals $2I_1$ and the current $I_8$ equals $2I_5$. The current $I_9$ which flows in the collector circuit of transistor $T_{11}$ consequently equals $3I_1$ and the current $I_{10}$ which flows through the collector circuit of transistor $T_{12}$ equals $3I_5$. When the currents $I_9$ and $I_{10}$ are constant and equal, it follows again that the base-emitter voltages of the transistors $T_1$, $T_3$, $T_4$, $T_6$, $T_{11}$ and $T_{12}$ are constant and moreover equal, provided that the base-emitter areas of said transistors are equal. As a result, the voltage across the resistor R equals the input difference voltage. The currents $I_9$ and $I_{10}$ are realized in that the connection points 17 and 18 are connected to points of constant potential. The base-emitter voltages of the transistors $T_{13}$ and $T_{14}$ are equal to the voltage between the connection point 18 and the negative supply point 12, so that the collector currents of said transistors are equal. The currents $I_9$ and $I_{10}$ are each the sum of the collector current of the transistors $T_{13}$ and $T_{14}$ respectively and the current which flows from the emitter of the transistors $T_{11}$ and $T_{12}$ respectively via the wiper of the potentiometer 19 to the negative supply connection through point 12. Thus, the currents $I_9$ and $I_{10}$ are adjustable relative to each other by adjustment of the potentiometer 19, which results in an offset control, by means of which the levels of the d.c. components of the output current can be offset relative to each other. As the base-emitter voltages of the transistors $T_{11}$ and $T_{12}$ are temperature dependent, the voltages between the emitters of the transistors $T_{11}$ and $T_{12}$ and the wiper of the potentiometer 19 will vary with temperature at a constant voltage at the connection point 17, so that the offset becomes temperature dependent. This problem can be solved by composing the voltage at the connection point 17 of a temperature-independent component and a component which varies with the temperature in a similar way as the base-emitter voltages of the transistors $T_{11}$ and $T_{12}$.

The circuit arrangement of FIG. 5 may be improved with respect to the gain of "common-mode" signals. For this purpose the part of the circuit of FIG. 5 which is surrounded by dashed lines is replaced by the circuit of FIG. 6. This corresponds to replacement of the diodes $T_{16}$ and $T_{19}$ by a single source current 32. The common-mode currents which flow through the collector-emitter paths of the transistors $T_{15}$ and $T_{18}$ are now no longer reflected to the input circuits 1 and 5 of the current mirror circuits, so that the input currents $I_1$ and $I_5$ depend to a smaller extent on the input d.c. level. The current source 32 may then carry the sum of the currents $I_1$ and $I_5$.

FIG. 7 shows an embodiment of a voltage-current converter according to the invention. The circuit includes the schematically shown voltage-current converters I and II, each with the balanced-voltage input connection points 9 and 10 and the balanced-current output connection points 2 and 6. The output connection point 2 of the voltage-current converter I and the output connection point 6 of the voltage-current converter II are connected to a first input connection point 27 of a subtractor circuit III, whose output current is the difference of the input currents. A second input connection point 28 of the subtractor circuit III is connected to the output connection point 6 of the voltage-current converter I and the output connection point 2 of the voltage-current converter II. The output connection point 29 of the subtractor circuit III is connected to the input connection point 9 of the voltage-current converter II via an amplifier IV.

As is shown in FIG. 7 a voltage $V_{in}$ is supplied to the input connection point 9 of the voltage-current converter I. To the input connection points 10 of the two voltage-current converters a reference voltage $V_{ref}$ is applied. The voltage at the input connection point 9 of the voltage-current converter II is $V_{uit}$. The output current at output connection point 2 of the voltage-current converter I is $i_1$, so that the output current at output connection point 6 of the voltage-current converter I equals $-i_1$. At the output connection points 2 and 6 of voltage-current converter II the currents $i_2$ and $-i_2$ are available respectively. The output current of subtractor circuit III is then proportional to the difference of the currents $i_1$ and $i_2$. Said difference current is fed back to the input connection point 9 of the voltage-current converter II via the amplifier IV. Owing to this feedback the current $i_2$ equals the current $i_1$. When the resistance of the volage-current converter I equals $R_1$ and the resistance of the voltage-current converter II equals $R_2$, then:

$$V_{uit} - V_{ref} = \frac{R_2}{R_1}(V_{in} - V_{ref})$$

Thus, an amplifier is obtained whose gain factor is determined by the ratio of the two resistances $R_2$ and $R_1$.

When a voltage-current converter is employed in for example measuring amplifiers, it is desirable that the conversion factor can be selected, for example for selecting a suitable measuring range. As the conversion factor is determined by the value of the resistance R, this might be effected by including a different resistance between the terminals 3 and 7. However, this has the drawback that the switches are then included in the signal path and also affect the conversion factor. FIG. 8 illustrates a solution where said problem has been obviated.

The various elements of the circuit arrangement of FIG. 8 are numbered in accordance with the circuit arrangements of the other Figures. Between the input connection point 1 of the current mirror circuit $T_1$, $T_2$, $T_3$ and the output of the current mirror $T_{15}$, $T_{16}$, $T_{17}$ a switch is included which is constituted by a pnp transistor $T_{48}$ with control electrode 51. Similarly, a switch is included between the input connection point 5 of the current mirror circuit $T_4$, $T_5$, $T_6$ and the output connection point of the current mirror circuit $T_{18}$, $T_{19}$, $T_{20}$, which switch is constituted by a pnp transistor $T_{51}$ with control electrode 62. To the voltage-current converter a second pair of current mirror circuits $T_{41}$, $T_{42}$, $T_{43}$ and $T_{45}$, $T_{46}$, $T_{47}$ respectively has been added, of which current-mirror circuits the common connection points are connected to the common connection points of the current mirror circuits $T_1$, $T_2$, $T_3$ and $T_4$, $T_5$, $T_6$ respectively. The output connection points are connected to the balanced-output connection points 2 and 6 respectively and the second input connection points 43 and 47 respectively are mutually connected via a resistor $R_1$. The first input connection point 41 of the current mirror circuit $T_{41}$, $T_{42}$, $T_{43}$ is connected via a switch, which is constituted by a pnp transistor $T_{49}$ with control electrode 52, to the output of the current mirror circuit $T_{15}$, $T_{16}$, $T_{17}$ and similarly the first input connection point 45 of the current mirror circuit $T_{45}$, $T_{46}$, $T_{47}$ is connected via a switch, which is constituted by a pnp transistor $T_{50}$ with a control electrode 61, to the output of current mirror circuit $T_{18}$, $T_{19}$, $T_{20}$. Field effect transistors have been chosen for the input transistors $T_9$, $T_{10}$ in the present embodiment.

When the voltage at the control electrode 52 is sufficiently higher than the voltage at the control electrode 51 and similarly when the voltage at the control electrode 61 is sufficiently higher than the voltage at the control electrode 62, the transistors $T_{48}$ and $T_{51}$ will be conducting and the transistors $T_{49}$ and $T_{50}$ will be in the non-conducting state. Conversely, the transistors $T_{49}$ and $T_{50}$ can be turned on, whilst the transistors $T_{48}$ and $T_{51}$ are turned off, by means of the control voltages at the control electrodes 51, 52, 61 and 62. In the first case the current mirror circuits $T_1$, $T_2$, $T_3$ and $T_4$, $T_5$, $T_6$ will be energized and in the second case the current mirror circuits $T_{41}$, $T_{42}$, $T_{43}$ and $T_{45}$, $T_{46}$, $T_{47}$, so that the voltage-current conversion factor in the first case is determined by the resistor R and in the second case by the resistor $R_1$.

As previously stated, the signal currents, irrespective of the base currents, only flow through the main current paths of the transistors $T_2$, $T_{42}$, $T_{45}$ and $T_5$ and through the resistors R and $R_1$. The switching transistors $T_{48}$, $T_{49}$, $T_{50}$ and $T_{51}$ consequently have no influence on the conversion factor.

The voltage-current converter may be extended in a similar manner with several pairs of current mirror circuits, each having a separate conversion factor. Moreover the step described with reference to FIG. 8, may be applied to all embodiments of a voltage-current converter according to the invention, as for example shown in FIGS. 2, 4, 5 and 6.

In the embodiment of FIG. 8 switching is effected with pnp-transistors, which is less attractive in integrated circuits. In order to enable switching with npn transistors the part of the circuit of FIG. 8 shown within the dashed lines may be replaced by the part shown in FIG. 9.

The circuit of FIG. 9 comprises the current mirror circuits $T_{15}$, $T_{16}$, $T_{17}$ and $T_{18}$, $T_{19}$, $T_{20}$. The switching transistors $T_{48}$ and $T_{51}$, which are now of the npn-type, are included between the emitters of the transistors $T_{17}$ and $T_{20}$ respectively and the collectors of the transistors $T_{16}$ and $T_{19}$ respectively. The collectors of the transistors $T_{17}$ and $T_{20}$ are connected to the input connection points 1 and 5 respectively of the current-mirror circuits $T_1$, $T_2$, $T_3$ and $T_4$, $T_5$, $T_6$ respectively. The bases of the transistors $T_{17}$ and $T_{20}$ are connected to the bases of transistors $T_{417}$ and $T_{420}$ respectively, which are both of the pnp type. The collectors of the transistors $T_{417}$ and $T_{420}$ are connected to the input connection points 41 and 45 respectively of the current mirror circuits $T_{41}$, $T_{42}$, $T_{43}$ and $T_{45}$, $T_{46}$, $T_{47}$ respectively.

The emitters of the transistors $T_{417}$ and $T_{420}$ are connected to the collectors of the transistors $T_{16}$ and $T_{19}$ respectively via the main current paths of the npn switching transistors $T_{49}$ and $T_{50}$ respectively.

When the transistors $T_{48}$ and $T_{51}$ are in the conductive state and the transistors $T_{49}$ and $T_{50}$ are in the non-conductive state, the transistors $T_{15}$, $T_{16}$ and $T_{17}$ and the transistors $T_{18}$, $T_{19}$ and $T_{20}$ respectively constitute current mirror circuits and the current mirror circuits $T_1$, $T_2$, $T_3$ and $T_4$, $T_5$, $T_6$ respectively are energized. Conversely, when the transistors $T_{49}$ and $T_{50}$ are conductive and the transistors $T_{48}$ and $T_{51}$ are non-conductive, the transistors $T_{15}$, $T_{16}$ and $T_{417}$ and the transistors $T_{18}$, $T_{19}$ and $T_{420}$ respectively constitute current-mirror circuits and the current mirror circuits $T_{41}$, $T_{42}$, $T_{43}$ and $T_{45}$, $T_{46}$, $T_{47}$ respectively are energized. Thus, a switchable gain factor can be obtained again. Also is this case extension with several pairs of current mirror circuits is possible.

The step in accordance with FIG. 9 may be applied to different embodiments of a voltage-current converter, for example to the embodiments of FIGS. 5 and 6.

What is claimed is:

1. A voltage-current converter with a balanced-voltage input and a balanced-current output, comprising:
    a first current mirror circuit comprising first and second transistors, each having an emitter, base and collector, and a first semiconductor junction having an anode and cathode, said first and second transistors and said first semiconductor junction all being of a first conductivity type, said cathode of said first semiconductor junction being connected to said emitter of said first transistor, said collector of said first transistor being connected to said base of said second transistor, and said base of said first transistor being connected to said anode of said first semiconductor junction and said emitter of said second transistor;
    a second current mirror circuit comprising the same elements as said first current mirror circuit;
    a first current source circuit connected to said collector of said first transistor of said first current mirror circuit;
    a second current source circuit connected to said collector of said first transistor of said second current mirror circuit;
    a first impedance connected between said emitter of said second transistor of said first current mirror circuit and said emitter of said second transistor of said second current mirror circuit; and
    third and fourth transistors each having an emitter, base and collector, said emitter of said third transistor being connected to said emitter of said first transistor of said first current mirror circuit said emitter of said fourth transistor being connected to said emitter of said first transistor of said second current mirror;

the balanced-voltage input being between said bases of said third and fourth transistors, and the balanced-current output being between said collector of said second transistor of said first current mirror circuit and said collector of said second transistor of said second current mirror circuit.

2. A voltage-current converter as defined in claim 1 wherein said third and fourth transistors are of a second conductivity type opposite to said first conductivity type and said collectors of said third and fourth transistors are connected together to a point adapted for connection to a source of constant voltage potential.

3. A voltage-current converter as defined in claim 1 wherein said third and fourth transistors are of said first conductivity type, said collector of said third transistor being connected to said emitter of said second transistor of said first current mirror circuit, said collector of said fourth transistor being connected to said emitter of said second transistor of said second current mirror circuit, and further comprising a third current source circuit connected to said emitter of said third transistor and a fourth current source circuit connected to said emitter of said fourth transistor.

4. A voltage-current converter as defined in claim 1 wherein said first current source circuit comprises a third current mirror circuit comprising fifth and sixth transistors, each having an emitter, base and collector, and a second semi-conductor junction having an anode and cathode, said fifth and sixth transistors and said second semiconductor junction all being of a second conductivity type opposite to said first conductivity type, said cathode of said second semiconductor junction and said emitter of said fifth transistor being connected together to a point adapted for connection to a source of constant voltage potential, said collector of said fifth transistor being connected to said base of said sixth transistor, and said base of said fifth transistor being connected to said anode of said second semiconductor junction and said emitter of said sixth transistor, said second current source circuit comprises a fourth current mirror circuit comprising the same elements as said third current mirror circuit, said third and fourth transistors are of said first conductivity type, said collector of said third transistor being connected to said collector of said fifth transistor of said third current mirror circuit, said collector of said fourth transistor being connected to said collector of said fifth transistor of said fourth current mirror circuit, said collector of said sixth transistor of said third current mirror circuit being connected to said collector of said first transistor of said first current mirror circuit, said collector of said sixth transistor of said fourth current mirror circuit being connected to said collector of said first transistor of said second current mirror circuit, and said emitter of said sixth transistor of said third current mirror circuit being connected to said emitter of said sixth transistor of said fourth current mirror circuit, and further comprising a third current source circuit connected to said emitter of said third transistor and a fourth current source circuit connected to said emitter of said fourth transistor.

* * * * *